(12) United States Patent
Lee et al.

(10) Patent No.: US 7,759,864 B2
(45) Date of Patent: Jul. 20, 2010

(54) ORGANIC ELECTROLUMINESCENT DISPLAY DEVICE COMPRISING MOISTURE PREVENTING SEALING STRUCTURE

(75) Inventors: Byoung-June Lee, Gyeongbuk (KR); Nho-Hoon Myoung, Chungnam (KR); Min-Su Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 746 days.

(21) Appl. No.: 11/600,904

(22) Filed: Nov. 17, 2006

(65) Prior Publication Data

US 2007/0285007 A1    Dec. 13, 2007

(30) Foreign Application Priority Data

Jun. 12, 2006   (KR) ...................... 10-2006-0052564

(51) Int. Cl.
   H01J 1/62     (2006.01)
   H01J 63/04    (2006.01)
   H05B 33/04    (2006.01)

(52) U.S. Cl. ................. 313/512; 313/504; 313/506; 313/509; 257/59; 257/79; 428/690

(58) Field of Classification Search ......... 313/498–512; 257/59, 79; 428/690
   See application file for complete search history.

(56) References Cited

U.S. PATENT DOCUMENTS

| | | | |
|---|---|---|---|
| 6,833,668 B1 * | 12/2004 | Yamada et al. ............... | 313/505 |
| 7,109,654 B2 * | 9/2006 | Song et al. .................. | 313/512 |
| 7,306,346 B2 * | 12/2007 | Fukuoka et al. .............. | 362/84 |
| 7,510,982 B1 * | 3/2009 | Draeger et al. .............. | 438/783 |
| 2003/0062533 A1 * | 4/2003 | Yee et al. ...................... | 257/99 |
| 2003/0164681 A1 | 9/2003 | Fukuoka et al. | |
| 2004/0036410 A1 * | 2/2004 | Park et al. .................... | 313/504 |
| 2004/0178727 A1 * | 9/2004 | Song et al. .................. | 313/512 |
| 2004/0189196 A1 * | 9/2004 | Cok ........................... | 313/512 |
| 2005/0104513 A1 * | 5/2005 | Lee et al. .................... | 313/506 |
| 2005/0116636 A1 * | 6/2005 | Kang .......................... | 313/512 |
| 2005/0189878 A1 * | 9/2005 | Shitagami et al. ........... | 313/512 |
| 2005/0285522 A1 * | 12/2005 | Han et al. .................... | 313/512 |
| 2007/0164672 A1 * | 7/2007 | Omura et al. ................ | 313/512 |

FOREIGN PATENT DOCUMENTS

| CN | 1561551 | 1/2005 |
|---|---|---|
| CN | 1638575 | 7/2005 |

* cited by examiner

Primary Examiner—Sikha Roy
Assistant Examiner—Jose M Diaz
(74) Attorney, Agent, or Firm—Morgan Lewis & Bockius LLP

(57) ABSTRACT

An organic electroluminescent display (OELD) device includes first and second substrates facing each other and having a display region and a non-display region on a periphery of the display region, an organic electroluminescent diode in the display region of the first substrate, a protrusion formed with a first thickness and a first width in the non-display region of the first substrate, a groove formed with a first depth and a second width in the non-display region of the second substrate, wherein the protrusion is inserted into the groove, a seal pattern formed between the protrusion and the groove.

12 Claims, 8 Drawing Sheets

ORGANIC ELECTROLUMINESCENT DISPLAY DEVICE COMPRISING MOISTURE PREVENTING SEALING STRUCTURE

The present application claims the benefit of Korean Patent Application No. 2006-0052564 filed in Korea on Jun. 12, 2006, which is hereby incorporated by reference.

BACKGROUND OF THE INVENTION

1. Field of the Invention

The present invention relates to an organic electroluminescent display device, and more particularly, to an organic electroluminescent display device and a method of fabricating the same that is capable of preventing moisture from penetrating into the organic electroluminescent display device.

2. Discussion of the Related Art

In general, the organic electroluminescent display (OELD) device emits light by injecting electrons from a cathode and holes from an anode into an emission layer, combining the electrons with the holes, generating an exciton, and transforming the exciton from an excited state to a ground state. Unlike the liquid crystal display (LCD) device, the OELD device does not require an additional light source, and therefore has the advantage of compact volume and light weight.

FIG. 1 is a circuit diagram schematically illustrating an OELD device according to the related art. As shown in FIG. 1, the OELD device includes a gate line "GL" and a data line "DL", which cross each other to define a pixel region "P". Also, the OELD device includes a power line "PL" that is parallel to the data line "DL". On the pixel region "P", a switching thin film transistor (TFT) "STr", a driving TFT "DTr", a storage capacitor "StgC", and an organic electroluminescent diode "E" are formed. The switching TFT "STr" is formed at a crossing portion of the gate and data lines "GL" and "DL". The driving TFT "DTr" is electrically connected to the switching TFT "STr" and the organic electroluminescent diode "E". The organic electroluminescent diode "E" has a first electrode connected to the driving TFT "DTr" and has a second electrode connected to the power line "PL". The power line "PL" supplies a power voltage into the organic electroluminescent diode "E". The storage capacitor "StgC" is formed between the gate and source electrodes of the driving TFT "DTr".

When a voltage is supplied to the switching TFT "STr" through the gate line "GL", the switching TFT "STr" is turned ON. When another voltage is supplied to the driving TFT "DTr" through the data line "DL" and the switching TFT "STr", the driving TFT "DTr" is turned ON such that the organic electroluminescent diode "E" emits light. When the driving TFT "DTr" is turned OFF, the storage capacitor "StgC" keeps a voltage for the driving TFT "DTr". Thus, even if the switching TFT "STr" is turned OFF, a voltage to be supplied to the organic electroluminescent diode "E" is kept by the storage capacitor "StgC".

FIG. 2 is a schematic perspective view of an OELD device according to the related art. As shown in FIG. 2, the related art OELD device includes first and second substrates 3 and 31 that face and are spaced apart from each other. A seal pattern 40 is formed at edges of the first and second substrates 3 and 31 between the first and second substrates 3 and 31, thereby sealing the OELD device. The first substrate 3 is formed with the driving TFT "DTr", the switching TFT "STr" (of FIG. 1), and the storage capacitor "StgC" (of FIG. 1). Also, on the first substrate 3, a first electrode 12, a second electrode 16 and an organic luminescent layer 14 are arranged to constitute the organic electroluminescent diode "E" (of FIG. 1). The first electrode 12 is electrically connected to the driving TFT "DTr". The organic luminescent layer 14 is formed on the first electrode 12 and includes luminescent material patterns 14a, 14b, and 14c. The luminescent material patterns 14a, 14b, and 14c correspond to the pixel regions "P" (of FIG. 1) and have red, green, and blue colors "R", "G", and "B", respectively. The second electrode 16 is formed on the organic luminescent layer 14. The first and second electrodes 12 and 16 serve to create an electric field, by which the organic luminescent layer 14 emits light.

As shown in FIG. 2, the second substrate 31 is spaced apart from the second electrode 16 and includes a moisture absorbent 32 of barium oxide or calcium oxide. Since the organic luminescent layer 14 on the first substrate 3 deteriorates when it is exposed by oxygen or/and moisture, it is necessary to completely seal the first and second substrates 3 and 31 and form the moisture absorbent 23. In the related art, the first and second substrate 3 and 31 are attached using the seal pattern 40 under a condition of vacuum or an inert gas.

However, the related art has some problems. The first and second substrates 3 and 31 may be separated from each other if oxygen penetrates into the device. Also, moisture may penetrate through an interface between the seal pattern 40 and the first substrate 3 or between the seal pattern 40 and the second substrate 31. Moreover, the seal pattern 40 may not have a uniform width. In the event that the seal pattern 40 has a too thin portion, moisture penetrates into the device through that thin portion. In the event that the seal pattern 40 has a too thick portion, the seal pattern 40 may cover the gate line and the data line such that contact looseness occurs.

SUMMARY OF THE INVENTION

Accordingly, the present invention is directed to an organic electroluminescent display (OELD) device and a method of fabricating the same that substantially obviate one or more of the problems due to limitations and disadvantages of the related art.

An object of the present invention is to provide an OELD device that includes a protrusion on a first substrate and a groove on a second substrate and that prevents moisture penetrating into the organic electroluminescent diode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an OELD device includes first and second substrates facing each other and including a display region and a non-display region on a periphery of the display region, an organic electroluminescent diode in the display region of the first substrate, a protrusion formed in the non-display region of the first substrate and having a first thickness and a first width, a groove formed in the non-display region of the second substrate and having a first depth and a second width, wherein the protrusion is inserted into the groove, a seal pattern formed between the protrusion and the groove.

In another aspect of the present invention, an OELD device includes first and second substrates facing each other and including a display region and a non-display region on a periphery of the display region, an organic electroluminescent diode in the display region of the second substrate, a protrusion formed in the non-display region of the first substrate and having a first thickness and a first width, a groove formed in the non-display region of the second substrate and having a first depth and a second width, wherein the protrusion is inserted into the groove, a seal pattern formed between the protrusion and the groove.

In another aspect of the present invention, a method of fabricating an OELD device includes forming an organic electroluminescent diode in a display region of a first substrate including the display region and a non-display region on a periphery of the display region, forming a protrusion having a first thickness and a first width in the non-display region of the first substrate, forming a groove having a first depth and a second width in a non-display region of the second substrate including a display region and the non-display region on a periphery of the display region, disposing sealant on one of an inner surface of the groove and an end of the protrusion, attaching the first and second substrates by inserting the protrusion into the groove to form a seal pattern between the groove and the protrusion.

In another aspect of the present invention, a method of fabricating an OELD device includes forming a protrusion having a first thickness and a first width in a non-display region of a first substrate including a display region and the non-display region on a periphery of the display region, forming an organic electroluminescent diode in a display region of a second substrate including the display region and a non-display region on a periphery of the display region, forming a groove having a first depth and a second width in the non-display region of the second substrate, disposing sealant on one of an inner surface of the groove and an end of the protrusion, attaching the first and second substrates by inserting the protrusion into the groove to form a seal pattern between the groove and the protrusion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
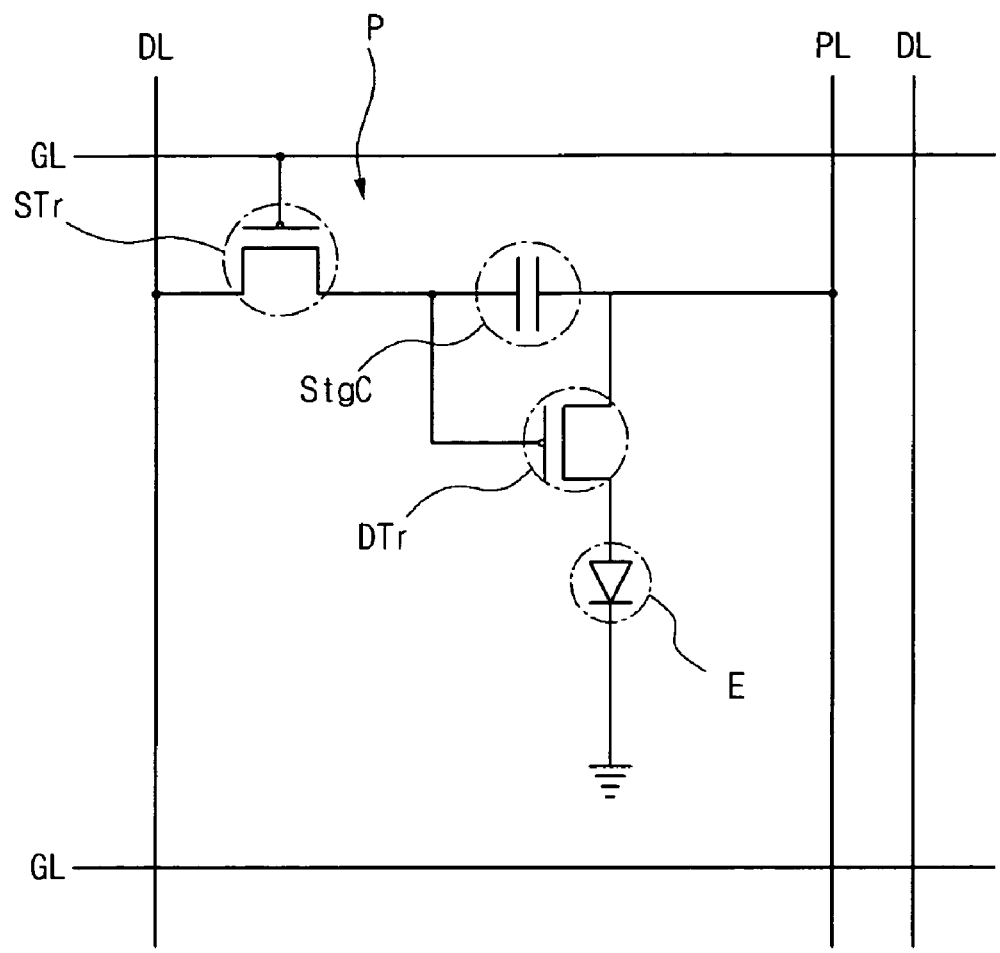
FIG. 1 is a circuit diagram schematically illustrating an organic electroluminescent display (OELD) device according to the related art.
Figure 2:
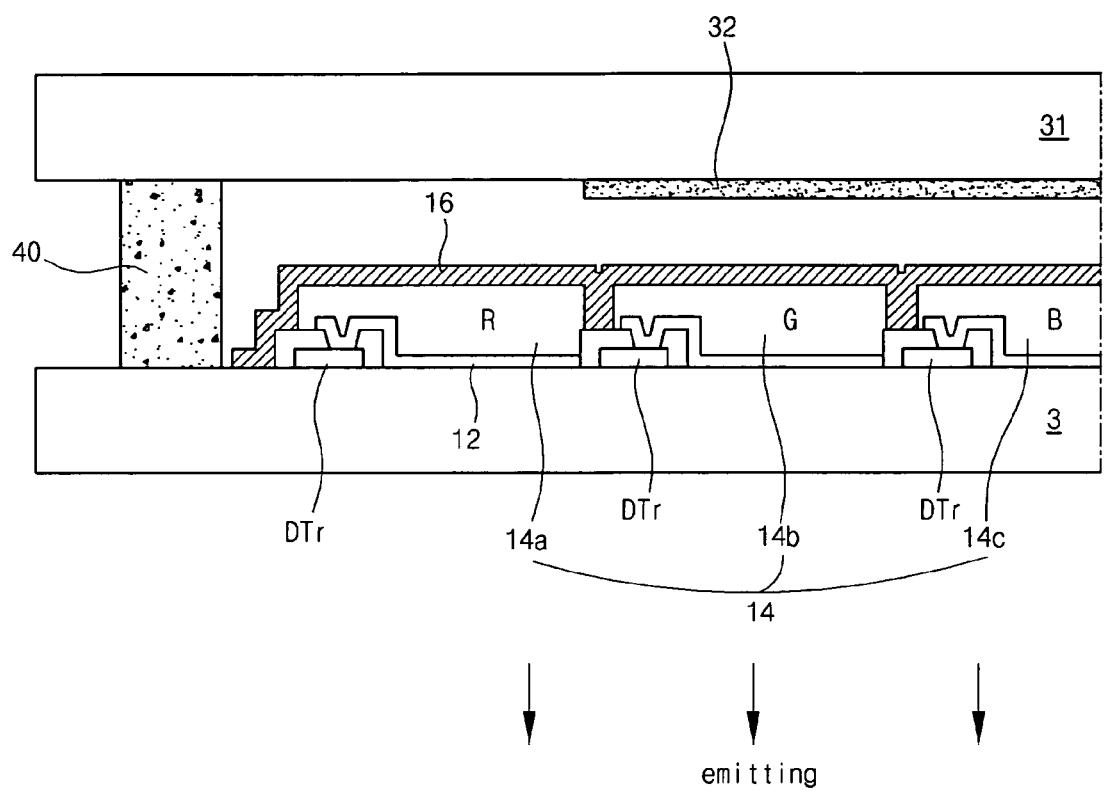
FIG. 2 is a schematic cross-sectional view of an OELD device according to the related art.
Figure 3:
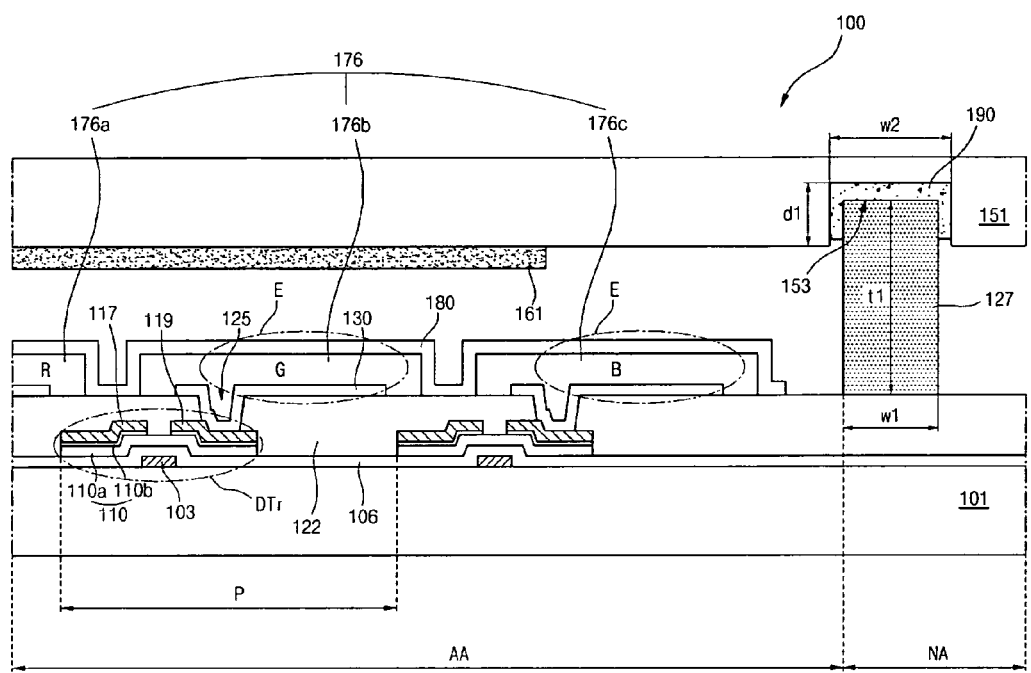
FIG. 3 is a cross-sectional view schematically illustrating an OELD device according to a first exemplary embodiment of the present invention.

FIG. 3 is a cross-sectional view schematically illustrating an organic electroluminescent display (OELD) device 100 according to a first exemplary embodiment of the present invention. As shown in FIG. 3, the OELD device 100 includes first and second substrates 101 and 151 that face each other. The first substrate 101 includes a display region "AA" and a non-display region "NA" on the periphery of the display region "AA". Although not shown, a gate line and a data line cross each other to thereby define a pixel region "P" in the display region "AA", a switching TFT is formed at a crossing portion between the gate and data lines, and a power line is parallel to the data line.

A driving TFT "DTr" is formed in the display region "AA" and is electrically connected to the switching TFT (not shown). The driving TFT "DTr" includes a gate electrode 103 on the first substrate 101, a gate insulating layer 106 on the gate electrode 103, a semiconductor layer 110 on the gate insulating layer 106, and source and drain electrodes 117 and 119 on the semiconductor layer 110. The semiconductor layer 110 includes an active layer 110a and an ohmic contact layer 110b. The source and drain electrodes 117 and 119 are spaced apart from each other. A passivation layer 122 is formed on the switching TFT (not shown) and the driving TFT "DTr". The passivation layer 122 includes a drain contact hole 125 that exposes the drain electrode 119 of the driving TFT "DTr".

An organic electroluminescent diode "E", which includes a first electrode 130, an organic luminescent layer 176, and a second electrode 180, is formed on the passivation layer 122. The first electrode 130 is formed on the passivation layer 122 in each pixel region "P" and contacts the drain electrode 119 of the driving TFT "DTr" through the drain contact hole 125. The organic luminescent layer 176 on the first electrode 130 includes organic luminescent patterns 176a, 176b, and 176c formed in the respective pixel regions "P". The organic luminescent patterns 176a, 176b, and 176c includes red, green, and blue colors "R", "G", and "B", respectively. The second electrode 180 is formed on the organic luminescent layer 176 throughout the display region "AA".

A protrusion 127 having a first width w1 and a first thickness t1 is formed on the passivation layer 122 in the non-display region "NA". The protrusion 127 is arranged along edges of the first substrate 101 to surround the display region "AA". A moisture absorbent 161 is formed on the second substrate 151 and corresponds to the display region "AA". A groove 153 having a second width w2 and a first depth d1 is formed on the second substrate 151 and corresponds to the protrusion 127. According to this exemplary embodiment, the second width w2 is wider than the first width w1, and the first depth d1 is shorter than the first thickness t1. Thus, when the first and second substrates 101 and 151 are attached to each other, the protrusion 127 is partially inserted into the groove 153. Since the protrusion 127 has the first thickness t1 greater than the first depth d1, a space is created between the first and second substrates 101 and 151. Moreover, a sealant (not shown) is formed in the groove 153 such that the protrusion 127 is inserted into the groove 153 and presses the sealant. Since the sealant is viscous, the sealant spreads out to thereby form a seal pattern 190 along an interface between the protrusion 127 and the groove 153. The seal pattern 190 may be shaped as a reverse "U". By such an arrangement of this exemplary embodiment, the problem in the related art that the seal pattern with the too thick portion may cover the gate and data lines can be resolved. Further, the moisture can also be prevented from penetrating into the device via interfaces having the reverse "U" shape between the seal pattern 190 and the protrusion 127 and between the seal pattern 190 and the groove 153. Alternatively, the protrusion 127 may be formed on the second substrate 151 while the groove 153 may be formed on the first substrate 101.

Figure 4:
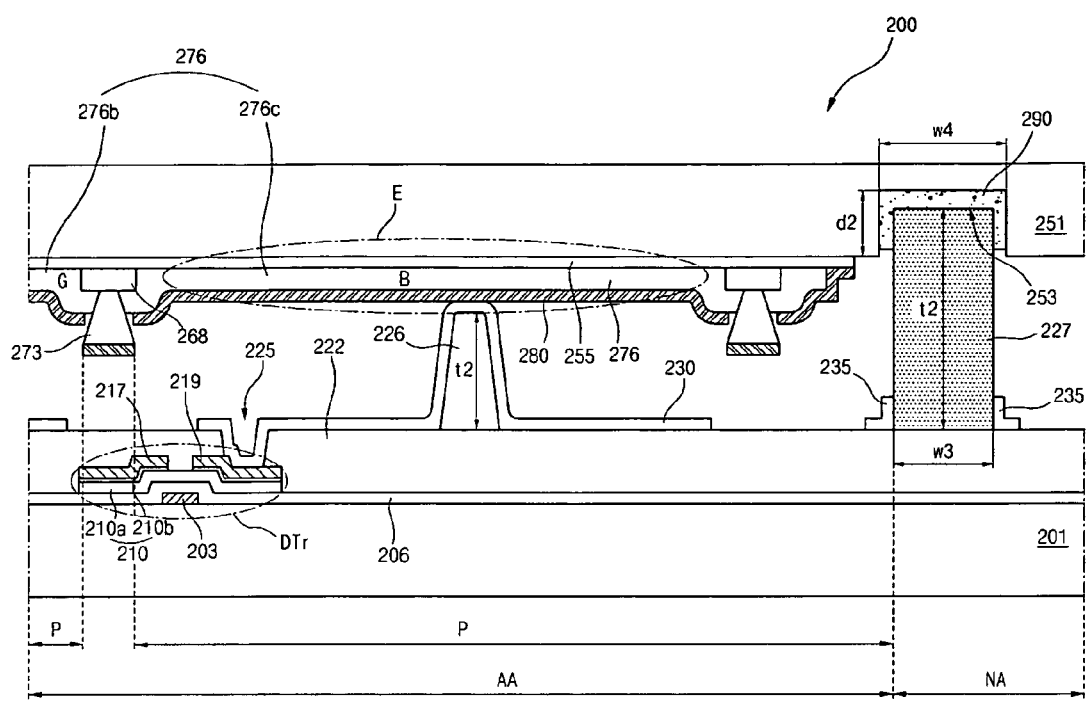
FIG. 4 is a cross-sectional view schematically illustrating an OELD device according to a second exemplary embodiment of the present invention.

FIG. 4 is a cross-sectional view schematically illustrating a dual-panel type OELD device 200 according to a second exemplary embodiment of the present invention. As shown in FIG. 4, the OELD device 200 includes a first substrate 201 and the second substrate 251 that face and are spaced from each other. The first substrate 201 includes a display region "AA" and a non-display region "NA" on the periphery of the display region "AA". Although not shown, a gate line and a data line cross each other to thereby define a pixel region "P" in the display region "AA", a switching TFT is formed at a crossing portion between the gate and data lines, and a power line is parallel to the data line. A driving TFT "DTr" is formed in the display region "AA" and is electrically connected to the switching TFT. The driving TFT "DTr" includes a gate electrode 203 on the first substrate 201, a gate insulating layer 206 on the gate electrode 203, a semiconductor layer 210 on the gate insulating layer 206, and source and drain electrodes 217 and 219 on the semiconductor layer 210. The semiconductor layer 210 includes an active layer 210a and an ohmic contact layer 210b. The source and drain electrodes 217 and 219 are spaced apart from each other. A passivation layer 222 is formed on the switching TFT (not shown) and the driving TFT "DTr". The passivation layer 222 includes a drain contact hole 225 that exposes the drain electrode 219 of the driving TFT "DTr".

A column spacer 226 with a predetermined height is formed on the passivation layer 222 in the pixel region "P". The column spacer 226 protrudes from the passivation layer 222. A connection electrode 230 is formed on the passivation layer 222 and the column spacer 226 in the pixel region "P". Since the connection electrode 230 is formed along the column spacer 226, the connection electrode 230 also protrudes from the passivation layer 222. Moreover, the connection electrode 230 contacts the drain electrode 219 of the driving TFT "DTr" through the drain contact hole 225.

A protrusion 227 having a third width w3 and a second thickness t2 is formed on the passivation layer 222 in the non-display region "NA". The protrusion 227 is arranged along edges of the first substrate 201 to surround the display region "AA". A metal pattern 235 may be formed along borders between the display region "AA" and the protrusion 227 and between the non-display region "NA" and the protrusion 227. The metal pattern 235 serves to prevent the moisture from penetrating into the device through an interface between the protrusion 227 and the passivation layer 222. The metal pattern 235 may be formed of the same material as the connection electrode 230.

An organic electroluminescent diode "E", which includes a first electrode 255, an organic luminescent layer 276 and a second electrode 280, is formed on the second substrate 251. The first electrode 255 is formed in the entire display region "AA" on the second substrate 251. The organic luminescent layer 276 is formed on the first electrode 255 and includes organic luminescent patterns 276a, 276b, and 276c. The organic luminescent patterns 276a, 276b, and 276c have a red color (not shown), a green color "G", and a blue color "B", respectively, thereby emitting light. The second electrode 280 is formed on the organic luminescent layer 276 in each pixel region "P". An isolation wall 273 and a buffer pattern 268 are formed on a border between the pixel regions "P". The isolation wall 273 and the buffer pattern 268 serve to partition the organic luminescent patterns 276a, 276b, and 276c and the second electrode 280 in each pixel region "P".

A groove 253 having a fourth width w4 and a second depth d2 is formed on the second substrate 251 and corresponds to the protrusion 227. The fourth width w2 is wider than the third width w3 of the protrusion 227, and the second depth d2 is shorter than the second thickness t2 of the protrusion 227. According to such an arrangement of this exemplary embodiment, when the first and second substrates 201 and 251 are attached to each other, the protrusion 227 is partially inserted into the groove 253. Since the protrusion 227 has the second thickness t2 greater than the second depth d2, a space is created between the first and second substrates 201 and 251. The connection electrode 230 on the first substrate 201 contacts the second electrode 280 on the second substrate 251 such that the driving TFT "DTr" on the first substrate 101 is electrically connected to the organic electroluminescent diode "E" on the second substrate 251.

A seal pattern 290 may be formed along an interface between the protrusion 227 and the groove 253 in the same manner as described with reference to FIG. 3. The first and second substrates 201 and 251 are attached to each other by the seal pattern 290, the protrusion 227, and the groove 253. The driving TFT "DTr" and the organic electroluminescent diode "E" are electrically connected to each other by the connection electrode 230. Although not shown, a moisture absorbent may be formed between the seal pattern 290 and the protrusion 227.

A third exemplary embodiment is a method of fabricating the OELD device of FIG. 4. This exemplary method will be described with reference to FIGS. 5A to 5D and FIG. 6A to 6D. FIGS. 5A to 5D are cross-sectional views schematically illustrating exemplary processes of fabricating the first substrate 201 of the OELD device, and FIGS. 6A to 6D are cross-sectional views schematically illustrating exemplary processes of fabricating the second substrate 251 of the OELD device.

Figure 5A:
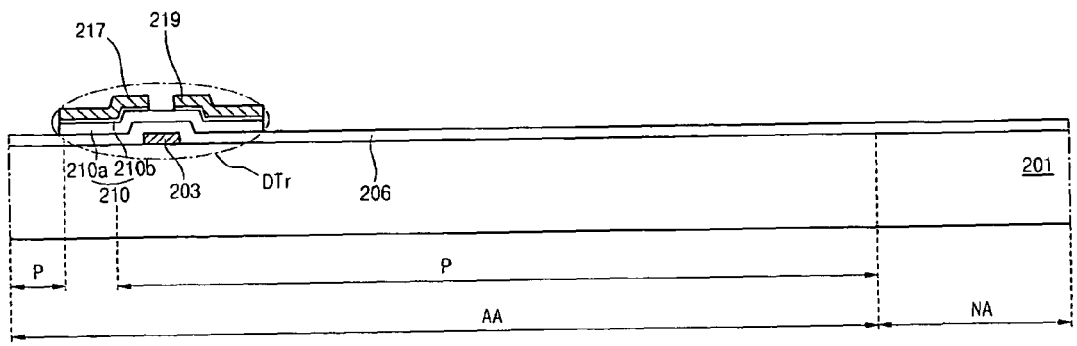
FIGS. 5A to 5D are cross-sectional views schematically illustrating exemplary processes of fabricating one substrate of the OELD device in FIG. 4 according to a third exemplary embodiment of the present invention.

As shown in FIG. 5A, the driving TFT "DTr" including the gate electrode 203, the gate insulating layer 206, the semiconductor layer 210, and the source and drain electrodes 217 and 219 is formed on the first substrate 201 in the pixel region "P". The gate electrode 203 is formed on the first substrate 201 by depositing and patterning a first metal layer (not shown), and the gate line (not shown) is simultaneously formed on the first substrate 201. The gate insulating layer 206 is formed on the gate electrode 203 and the gate line (not shown). The semiconductor layer 210 including the active layer 210a and the ohmic contact layer 210b is formed on the gate insulating layer 206 and corresponds to the gate electrode 203. The source and drain electrodes 217 and 219 are formed apart from each other on the semiconductor layer 210 by depositing and patterning a second metal layer (not shown), and the data line (not shown) is simultaneously formed on the gate insulating layer 206. The data line (not shown) crosses the gate line (not shown) to thereby define the pixel region "P". Although not shown, the switching TFT is formed on the first substrate 210 in the same manners as the driving TFT "DTr". The switching TFT is electrically connected to the driving TFT "DTr".

Figure 5B:
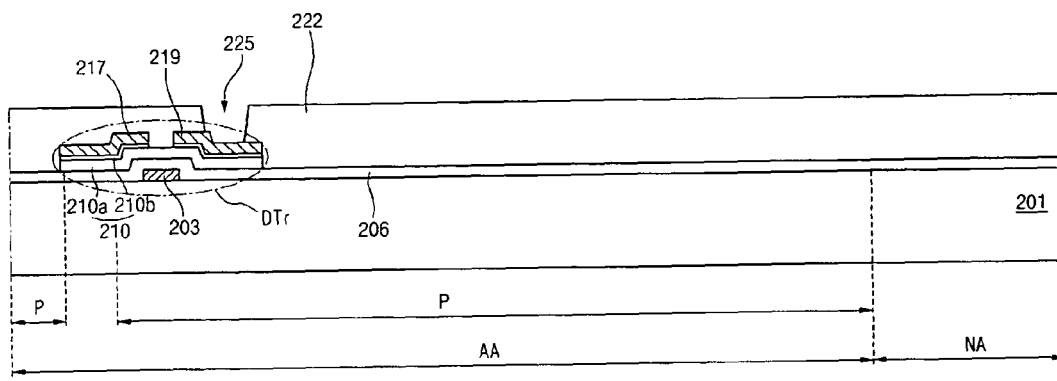

As shown in FIG. 5B, the passivation layer 222 is formed on the switching TFT (not shown) and the driving TFT "DTr". The drain contact hole 225 is formed through the passiviation layer 222, thereby exposing the drain electrode 219 of the driving TFT "DTr".

Figure 5C:
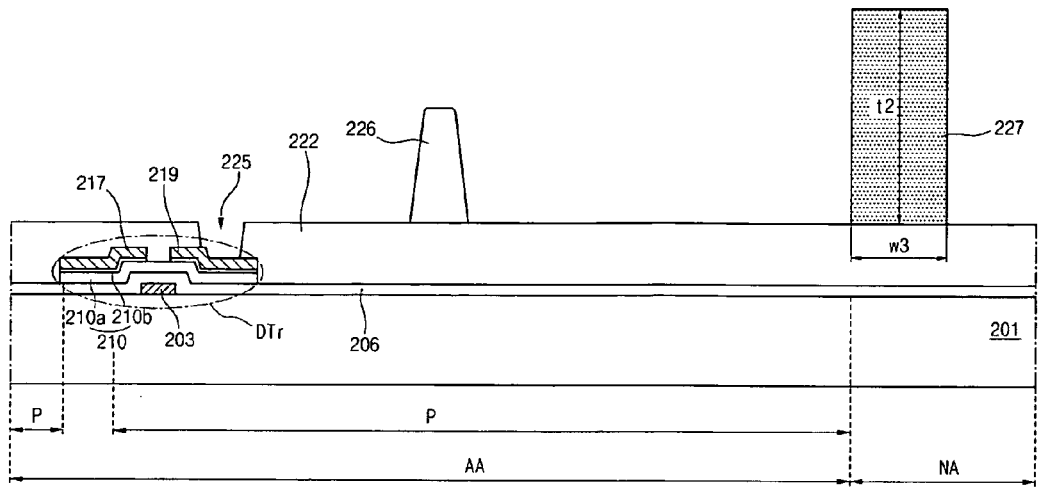

As shown in FIG. 5C, the column spacer 226 is formed on the passivation layer 222 in the pixel region "P" of the display region "AA". The column spacer 226 is arranged to electrically connect the driving TFT "DTr" on the first substrate 201 with the organic electroluminescent diode "E" on the second substrate 251. The protrusion 227 is formed with the third width w3 and the second thickness t2 on the passivation layer 222 in the non-displayer region "NA". The protrusion 227 may be made of a material having excellent properties of being adhesive to the passivation layer 222. The protrusion 227 may also be made of the same material as the passivation layer 222. The protrusion 227 may have a height at least as twice as the column spacer 226. The protrusion 227 is arranged along the edges of the first substrate to surround the display region "AA". The column spacer 230 and the protrusion 227 may be simultaneously formed by a half-tone mask process.

Figure 5D:
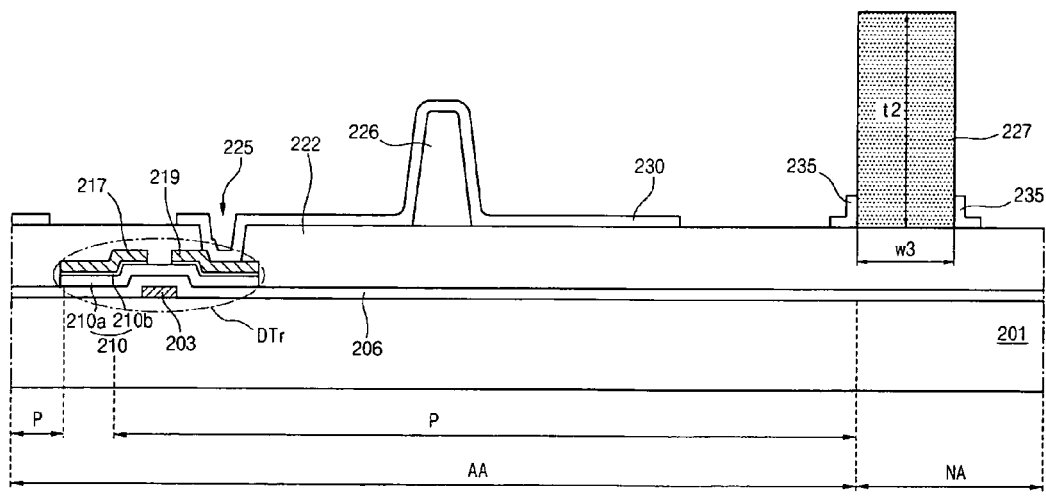

As shown in FIG. 5D, the connection electrode 230 and the metal pattern 235 may be formed on the passivation layer 222, the column spacer 226, and the protrusion 227 by depositing and patterning a third metal layer (not shown). The connection electrode 230 contacts the drain electrode 219 of the driving TFT "DTr" and covers the column spacer 226. The metal pattern 235 is arranged along borders between the display region "AA" and the protrusion 227 and between the non-display region "NA" and the protrusion 227. The metal pattern 235 serves to prevent the moisture from penetrating into the device through the interface between the protrusion 227 and the passivation layer 222. In addition, since the protrusion 227 has the excellent adhesive properties, the metal pattern 235 may be omitted.

In the first exemplary embodiment described with reference to FIG. 3, the organic electroluminescent diode "E" is formed on the first substrate 101. In this case, after the process of FIG. 5B is performed, the first electrode 130, the organic luminescent layer 176, and the second electrode 180 are sequentially formed on the passivation layer 122.

Figure 6A:
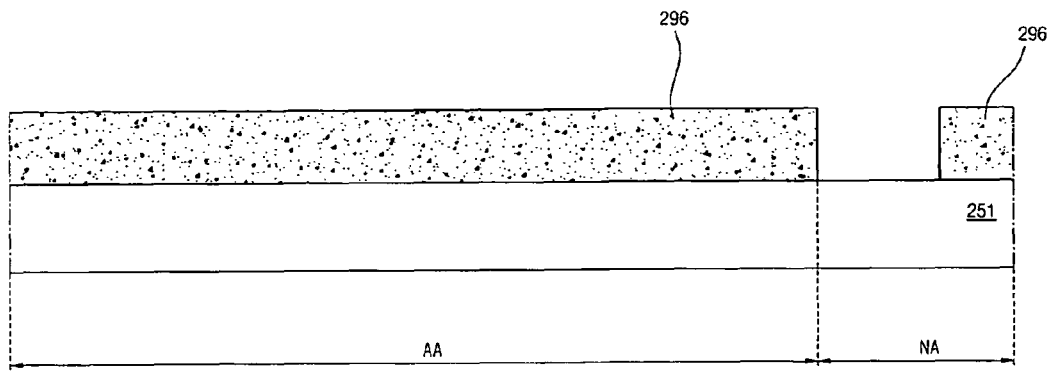
FIGS. 6A to 6D are cross-sectional views schematically illustrating exemplary processes of fabricating the other substrate of the OELD device in FIG. 4 according to the third exemplary embodiment of the present invention.

Next, the exemplary processes of fabricating the second substrate 251 in FIG. 4 are described with reference to FIGS. 6A to 6D. As shown in FIG. 6A, a photoresist (PR) pattern 296 is formed on the second substrate 251. The PR pattern 296 exposes a part of the non-display region "NA".

Figure 6B:
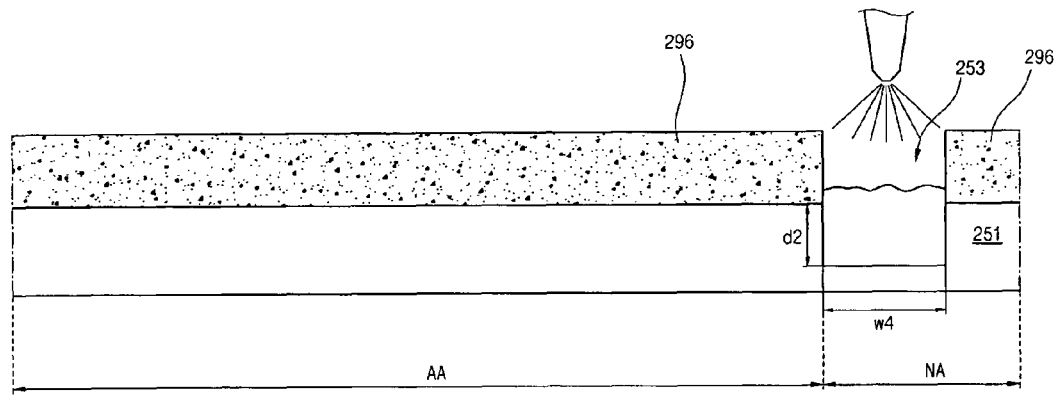

As shown in FIG. 6B, the second substrate 251 exposed by the PR pattern 296 is etched such that the groove 253 having the fourth width w4 and the second depth d2 is formed on the second substrate 251 in the non-display region "NA". If the second substrate 251 is made of glass, an etchant, such as fluoric acid or nitric acid, may be utilized for etching the second substrate 251. The etchant may be dispersed on the portion using the spray. The groove 253 may be formed by dipping the second substrate 251 into the etchant.

Figure 6C:
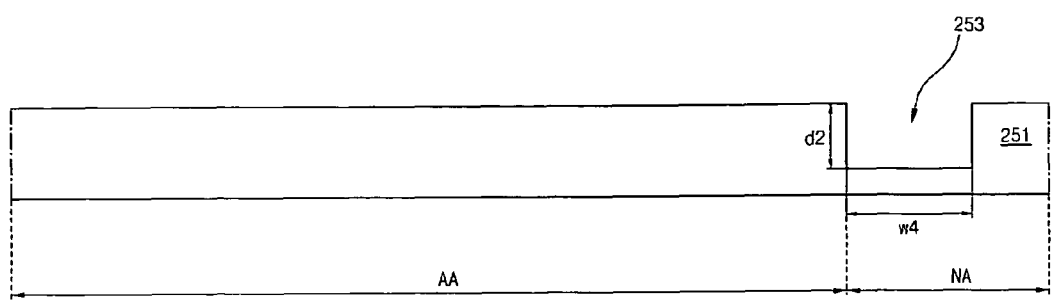

Then, as shown in FIG. 6C, the PR pattern 296 is removed from the second substrate 251.

Figure 6D:
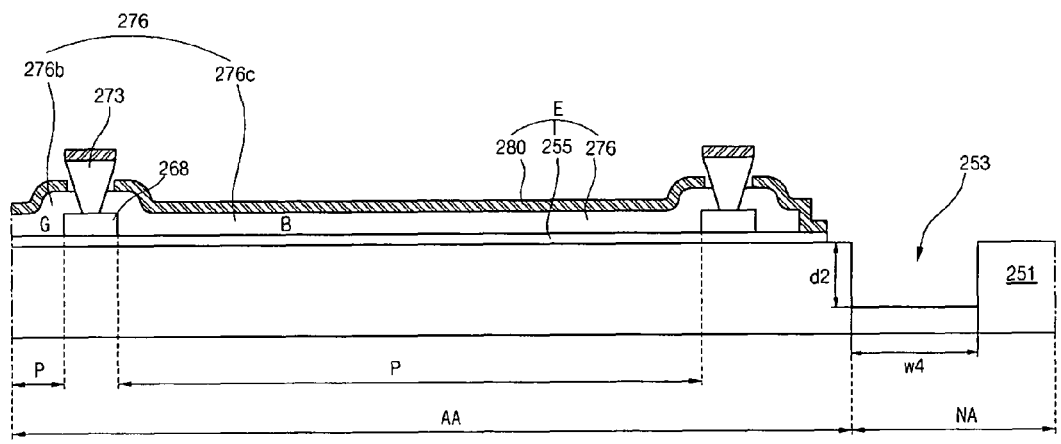

As shown in FIG. 6D, the organic electroluminescent diode "E" including the first electrode 255, the organic luminescent layer 276, and the second electrode 280 is formed on the second substrate 251 in the display region "AA". The first electrode 255 is formed in the entire surface of the display region "AA". The buffer pattern 268 and the isolating wall 273 are formed in a border between the pixel regions "P". The organic luminescent layer 276 including the organic luminescent pattern 276a, 276b, and 276c is formed on the first electrode 255 in each pixel region "P". Finally, the second electrode 280 is formed on the organic luminescent layer 276 in the each pixel region "P". When the organic luminescent layer 276 is formed in each pixel region "P" using a shadow mask, the isolation wall 273 may be omitted.

Although not shown, the sealant may be formed in the groove 253. The sealant may also be formed on the protrusion 227. Next, the first and second substrate 201 and 251 are attached to each other so that the protrusion 227 corresponds to the groove 253 and the connection electrode 230 contacts the second electrode 280. It may be performed under nitrogen gas or vacuum. The protrusion 227 and the groove 253 press the sealant to form the seal pattern 290 between the protrusion 227 and the groove 253.

According to the exemplary embodiments of the present invention, by forming a protrusion on a first substrate and a groove on a second substrate, the moisture can be prevented from penetrating into the OELD device. Alternatively, the protrusion may be formed on the second substrate while the groove may be formed on the first substrate.

It will be apparent to those skilled in the art that various modifications and variations can be made in the organic electroluminescent display device and method of fabricating the same of the present invention without departing from the spirit or scope of the invention. Thus, it is intended that the present invention covers the modifications and variations of this invention provided they come within the scope of the appended claims and their equivalents.

What is claimed is:

1. An organic electroluminescent display (OELD) device, comprising:
   first and second substrates facing each other and including a display region and a non-display region on a periphery of the display region;
   an organic electroluminescent diode in the display region of the first substrate;
   a protrusion formed, with a first thickness and a first width, in the non-display region of the first substrate;
   a groove formed, with a first depth and a second width, in the non-display region of the second substrate, wherein a top portion of the protrusion is inserted into the groove;
   a first metal pattern covering an inner surface of a bottom portion of the protrusion;
   a second metal pattern covering an outer surface of the bottom portion of the protrusion; and
   a seal pattern formed between the protrusion and the groove.

2. An organic electroluminescent display (OELD) device, comprising:
   first and second substrates facing each other and including a display region and a non-display region on a periphery of the display region;
   an organic electroluminescent diode in the display region of the second substrate;
   a protrusion formed, with a first thickness and a first width, in the non-display region of the first substrate;
   a groove formed, with a first depth and a second width, in the non-display region of the second substrate, wherein a top portion of the protrusion is inserted into the groove;
   a first metal pattern covering an inner surface of a bottom portion of the protrusion;
   a second metal pattern covering an outer surface of the bottom portion of the protrusion; and
   a seal pattern formed between the protrusion and the groove.

3. The OELD device according to claim 1, wherein the first thickness is greater than the first depth and the first width is less than the second width.

4. The OELD device according to claim 1, wherein the organic electroluminescent diode includes a first electrode, a second electrode, and an organic luminescent layer interposed between the first and second electrodes.

5. The OELD device according to claim 1, further comprising a thin film transistor formed in the display region of the first substrate between the first substrate and the organic electroluminescent diode, wherein the thin film transistor includes a gate electrode, a gate insulating layer, a semiconductor layer, a source electrode and a drain electrode.

6. The OELD device according to claim 5, further comprising a passivation layer including a drain contact hole formed between the thin film transistor and the organic electroluminescent diode, wherein the drain contact hole exposes the drain electrode of the thin film transistor, and the organic electroluminescent diode contacts the drain electrode through the drain contact hole.

7. The OELD device according to claim 6, wherein the protrusion is formed on the passivation layer and includes a same material as the passivation layer.

8. The OELD device according to claim 2, wherein the first thickness is greater than the first depth, and the first width is less than the second width.

9. The OELD device according to claim 2, wherein the organic electroluminescent diode includes a first electrode, a second electrode, and an organic luminescent layer interposed between the first and second electrodes.

10. The OELD device according to claim 2, further comprising a thin film transistor and a connection electrode that are formed in the display region of the first substrate, wherein the thin film transistor is arranged between the first substrate and the connection electrode, the thin film transistor includes a gate electrode, a gate insulating layer, a semiconductor layer, a source electrode and a drain electrode, and the organic electrode luminescent diode is electrically connected to the thin film transistor through the connection electrode.

11. The OELD device according to claim 10, further comprising a passivation layer that includes a drain contact hole and is formed on the thin film transistor, wherein the drain contact hole exposes the drain electrode of the thin film transistor and the connection electrode contacts the drain electrode through the drain contact hole.

12. The OELD device according to claim 11, wherein the protrusion is formed on the passivation layer and includes a same material as the passivation layer.

* * * * *